(12) United States Patent
Byers et al.

(10) Patent No.: US 7,206,888 B2
(45) Date of Patent: Apr. 17, 2007

(54) BACKPLANE CONFIGURATION WITH SHORTEST-PATH-RELATIVE-SHIFT ROUTING

(75) Inventors: Charles Calvin Byers, Wheaton, IL (US); Robert Allen Novotny, Naperville, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 362 days.

(21) Appl. No.: 10/626,215

(22) Filed: Jul. 24, 2003

(65) Prior Publication Data

US 2005/0016766 A1 Jan. 27, 2005

(51) Int. Cl.
*G06F 13/00* (2006.01)

(52) U.S. Cl. .................... 710/316; 710/100; 710/301; 361/142

(58) Field of Classification Search ........ 710/300–304, 710/100, 105, 316–317; 370/362, 364; 439/55, 439/59–61, 631; 361/1–3, 142
See application file for complete search history.

(56) References Cited

U.S. PATENT DOCUMENTS

| | | | | |
|---|---|---|---|---|
| 5,132,635 A | * | 7/1992 | Kennedy | 324/763 |
| 5,642,264 A | * | 6/1997 | Cantrell | 361/802 |
| 5,754,804 A | * | 5/1998 | Cheselka et al. | 710/305 |
| 6,015,300 A | * | 1/2000 | Schmidt et al. | 439/61 |
| 6,154,449 A | * | 11/2000 | Rhodes et al. | 370/254 |
| 6,377,470 B1 | * | 4/2002 | Hayward et al. | 361/796 |
| 6,438,625 B1 | * | 8/2002 | Olson | 710/9 |
| 6,578,103 B1 | * | 6/2003 | Hill et al. | 710/313 |
| 6,637,431 B2 | * | 10/2003 | Ekelius et al. | 128/203.15 |
| 6,693,901 B1 | * | 2/2004 | Byers et al. | 370/362 |
| 6,814,582 B2 | * | 11/2004 | Vadasz et al. | 439/61 |
| 6,853,680 B1 | * | 2/2005 | Nikolich | 375/222 |

* cited by examiner

*Primary Examiner*—Mark H. Rinehart
*Assistant Examiner*—Kim T. Huynh

(57) ABSTRACT

A novel backplane routing and configuration (200) supports a full mesh architecture. In this novel configuration, a circuit pack determines which backplane signals to use for a transmission based on the relative distance across the backplane between the board sending the communication and the board receiving the communication. Boards sending the same relative distance use the same rows of signals (204). That is, each row associated with the meshed interconnection is assigned a relative shift or distance for a connection. The rows (204) that represent a greater relative distance for shift between boards are intermixed next to rows (204) that have a relatively short distance between shifts or boards. In this manner, the number of layers required is minimized and the utilization of routing channels is optimized. In particular, for a N slot backplane with one routing channel between rows, (N/2+1) layers are required, rather than N layers. And, vertical routing is not required.

15 Claims, 2 Drawing Sheets

BACKPLANE CONFIGURATION WITH SHORTEST-PATH-RELATIVE-SHIFT ROUTING

FIELD OF THE INVENTION

The present invention generally relates to large electronic systems, and in particular, to a backplane configuration with shortest-path, relative-shift routing.

BACKGROUND OF THE INVENTION

Large electronic systems, as used in computing, data networking, and telecommunications elements, often use a common backplane to provide high speed interconnection between several circuit boards, packs or modules that plug into slots in the backplane. The backplane is typically constructed of a multi-layer circuit board with conductive traces selectively routed to provide the high-speed interconnection. Connectors are provided on the backplane to couple circuit boards, packs, or modules which are held in place using a slotted chassis. The properties of these backplanes often have large influence over the capacity, performance, reliability, cost, and scale properties of electronic systems. Some backplane designs provide high capacity, while others provide low cost.

A number of factors must be considered in backplane design including, functionality, connector density, number of layers required and electrical characteristics, including crosstalk, signal attenuation, reflections, and transmission line effects. The electrical characteristics are affected by trace length (attenuation) and any vias (parasitic capacitance) in the signal path.

Currently, there are two predominant architectures for providing backplane transport infrastructures in high-speed telecommunications platforms: the bus and the fabric. These architectures both have limitations preventing the creation of a truly universal platform.

Bus-based backplanes use a large set of parallel signals, where each signal typically touches each slot and hence each board. This interconnection scheme is versatile and low cost, but imposes practical limits of a few billion bits per second on the maximum system throughput and also limits reliability. The total throughput must also be shared among all boards on the backplane. Buses are typically used in smaller systems that do not process large amounts of broadband traffic, or in systems with severe cost constraints. In particular, bus-based backplanes have a very low cost of common elements, and therefore permit low system costs, especially where a system is not equipped with all of its circuit cards or modules initially.

Fabric based systems use a central high-speed fabric or hub to switch traffic between all modules. High-speed point-to-point connections (either parallel or serial) are routed over a cable or backplane between each module and the central fabric, in a star topology. The central fabric can provide the large bandwidths (over 1 trillion bits per second) needed to support high-speed computing or broadband communications. Unfortunately, because the full central fabric, with support for the maximum number of connections, must be installed before any modules can be interconnected, the cost of such a system is often quite high, especially for partially equipped systems, where the large cost of the fabric is only amortized over a few modules.

A prior art backplane design provides a plurality of slots, with each slot being adapted to receive a blade or circuit pack. This prior art backplane design is commonly used in a star configuration where all slots route to one or more particular slots, which are used, for example, for the central fabric. For this configuration, the circuit packs or blades are designed in such a manner, that any board may operate in any slot. More specifically, a particular physical interface on the board is always the interface for a particular slot to reach the central fabric. For example, connector pins A2 are always the interface for connection to the board in slot 1, regardless of which slot the board is in. In other words, for every board, no matter which backplane slot it is in, connector pins A2 provide the physical path to slot 1 (e.g., the central fabric). Therefore, whenever circuitry on the board needs to communicate with the board in slot 1, regardless of which slot the board is plugged into, pins A2 provide the interface to slot 1.

When another configuration, such as a mesh configuration (each board communicates directly to every other board) is used instead of the star configuration, the backplane routing becomes very complicated. In particular, if the backplane is designed such that any board communicates with another board based on a mapping of rows to slots without regard to the location of the sending board, as in the star configuration described above, then vertical as well as horizontal routing is typically required and trace length is increased. This is undesirable, since in Manhattan style routing, vertical and horizontal routing are on different layers. Each layer adds cost and increases backplane thickness and weight. In addition, having to route a signal between horizontal and vertical routing requires more vias, which also adds to the cost and reduces performance. And, the longer traces required adversely affect performance. FIG. 1 illustrates the problem of routing a mesh configuration using traditional backplane slot-independent routing.

The backplane 100 illustrated in FIG. 1 has six slots 102a–f for receiving circuit packs. Each slot 102 has six rows 104a–f, with interfaces for making routing connections. In the example shown in FIG. 1, each row has a receiver pin, identified with the letter "R," and a transmitter pin, identified with the letter "T." Note that the "T" and "R" each represent a differential pair. That is, there are two pins and traces associated with "T" and two pins and traces associated with "R." In this example, there is only one routing channel 106 per layer between each row. However, an additional routing channel per layer is available above the top row and an additional routing channel per layer is available below the bottom row. Each routing channel accommodates a differential signal pair.

In FIG. 1, each row 104 for a slot 102 is connected via backplane routing (illustrated by the lines with arrows) to the slot corresponding to the row. In other words, row one 104a is the interface to slot one (102a). More specifically, top row 104a of each slot (102a–f) is associated with slot one in the backplane. That is, backplane routing associates and connects the top row 104a of slot two (102b) to the second row 104b of slot one (102a). Similarly, the top row 104a of slot three (102c) is connected via backplane routing to row three 104c of slot one(102a). This pattern continues with row one 104a of slot six (102f) being interconnected to row six 104f of slot one 102a. There is no routing required in the backplane to connect row one of slot one to itself, because this interface can be accounted for directly on the circuit pack. Alternatively, routing can be provided in the backplane to connect the transmitter and receiver of row one to each other. Or, these pins may be used to provide a geographic address or slot number.

In an analogous manner to that described above with respect to row one 104a and slot one 102a, row two 104b is the interface for slot two 102b. This pattern continues, and finally, row six 104f is the interface for slot six 102f. In other words, row X of slot Y is interconnected to row Y of slot X.

Traditional backplane routing, as applied to the mesh configuration, is undesirable and costly. Generally, in such an arrangement, for N slots, N layers are required, unless extra vias are used. For the six slot example shown in FIG. 1, six routing layers and six rows are required to maintain symmetry in the routing. And vertical routing is required. See the routing congestion between slots 102c and 102d in FIG. 1.

Therefore a need exists for a novel backplane configuration that minimizes backplane trace length, minimizes layers and also minimizes the number of vias required.

SUMMARY OF THE INVENTION

An advance in the art is made by the present intention which provides a novel backplane routing and configuration to support a full mesh architecture. In this novel configuration, a circuit pack determines which backplane signals to use for a transmission based on the relative distance between the board sending the communication and the board receiving the communication. Boards sending the same relative distance use the same rows of signals. In other words, each row associated with the meshed interconnection is assigned a relative shift or distance for a connection. This configuration minimizes backplane trace length.

In a preferred arrangement, the rows or sets of connections that represent a greater relative distance for shift between boards are intermixed next to rows or sets of connections that have a relatively short distance between shifts or boards. In this manner, the number of layers required is minimized and the utilization of routing channels is optimized. In particular, for a N slot backplane, (N/2+1) layers are required, rather than N layers. And, vertical routing is not required.

BRIEF DESCRIPTION OF THE PREFERRED EMBODIMENTS

Figure 1:
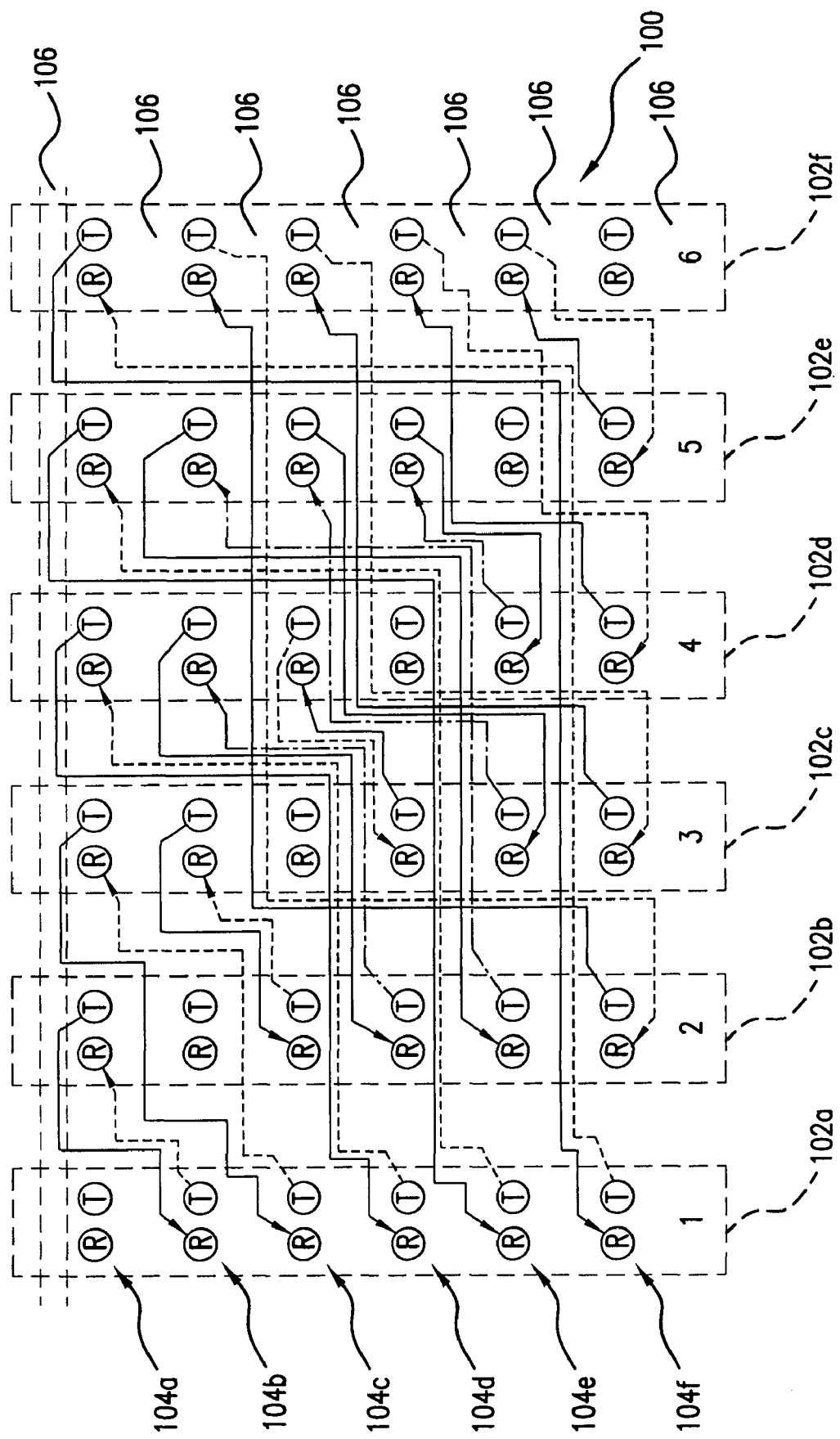
FIG. 1 is a schematic block diagram of a six slot conventional backplane routed in accordance with the prior art.
Figure 2:
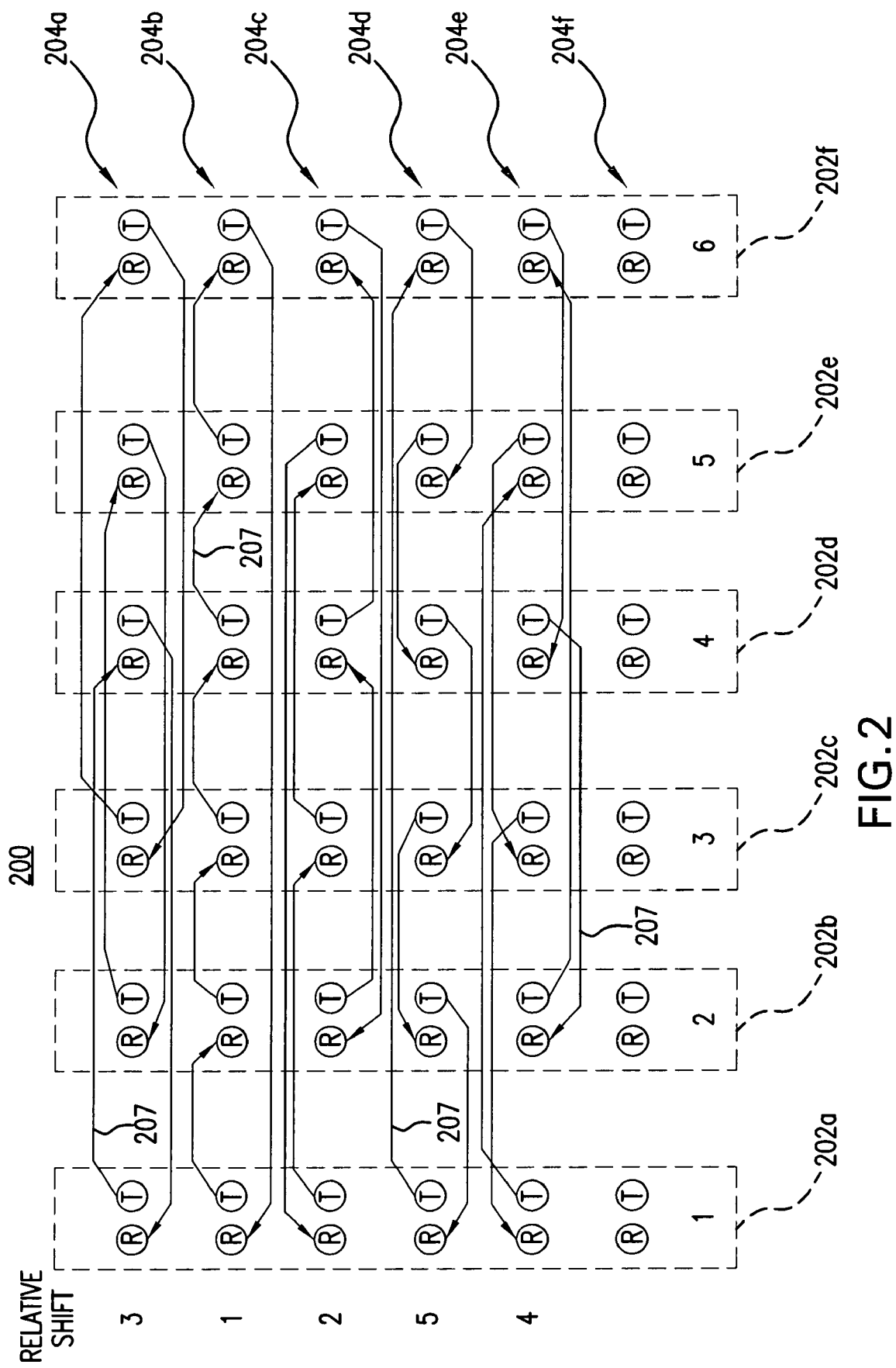
FIG. 2 is a schematic block diagram of a six slot backplane with optimized routing in accordance with the present invention.

FIG. 2 is a schematic block diagram of a preferred embodiment of a backplane system 200 in accordance with the present invention. Backplane system 200 includes six slots 202a–f. Each slot has six rows of connections 204a–f. A plurality of traces 207 interconnect the rows of connections. Each row 204 of each slot 202 includes two connections: one for receiving labeled "R" and one for transmitting, labeled "T." As described above with respect to FIG. 1, "T" and "R" may both represent differential pairs.

Backplane system 200 is configured to form a full mesh. That is, each slot has a connection to every other slot. More specifically, a transmit/receive pair is provided for each slot to connect to every other slot. Five sets or rows of connections 204a–e are used to interconnect the six slots 202 in a full mesh. The sixth row of connections may be used for signals not required for the mesh. Notably, backplane system 200 does not have an area of congestion such as that between slots 102c and 102d in FIG. 1. Also of note is the efficient reuse of a routing channel for multiple signals between row 204a and row 204b.

In accordance with the present invention, backplane system 200 is implemented using a multi-layer printed circuit board. In particular, a four layer circuit board is used to implement backplane system 200. Since a four layer board is used for backplane system 200, there are four routing channels between each row of connection points. That is, a routing channel per layer. In addition, there four routing channels (one per layer) above the first row of connections 204a and four routing channels (one per layer) below the fifth row of connections 204e.

Rather than have a conventional routing assignment where row X of slot Y connects to row Y of slot X, the backplane system 200 assigns each row of connections 204 a relative shift that determines which slot is connected to another slot at a particular row of connections. In FIG. 2, the first row 204a has a relative shift of 3. This means that at this row of connections 204a, each slot is connected to the board that is 3 slots away to the right. Counting wraps around at the ends, so that for the sake of counting shifts, slot 202f is directly adjacent to, that is, one shift away from, slot 202a. Similarly, the second row of connections 204b is assigned a relative shift of 1. This means that at this row of connections 204b, each slot is connected to the board that is one slot away to the right, that is, the directly adjacent board to the right. The third row of connections 204c is assigned a relative shift 2. This means that at this row of connections 204c, each slot 202 is connected to the slot that is two slots away to the right. Similarly, the fourth row 204d and fifth row 204e have relative shifts of 5 and 4, respectively, with the fourth row 204d connecting the slots five slots away to the right and the fifth row 204e connecting the slots four slots away to the right. Of course the relative shifts may be restated with respect to the distance to the left. In this case the relative shifts for the first row, second row, third row, fourth row and fifth row, would be considered –3, –5, –4, –1, and –2, respectively, where the negative sign indicates a left shift.

It is readily seen in FIG. 2 that no more than four routing channels between rows are used to provide the full mesh connection. Advantageously, this means that only four layers are required, that no additional vias are required for routing, and that no vertical routing is required.

The assignment of relative shifts to rows for the embodiment shown in FIG. 2 is not completely arbitrary. Instead, the assignment of relative shifts to certain rows is optimized to use the fewest number of layers. This is accomplished by considering which relative shifts require the most routing channels and which relative shifts require the least number of routing channels. More specifically, the relative shifts of adjacent rows are selected such that the routing channels required do not exceed the number of available routing channels for a given number of layers.

The number of routing channels varies with the relative shift. The number of routing channels required for a relative shift provides a measure of difficulty or complexity associated with that relative shift. Where N is the number of slots (N is an even integer), The most difficult to least difficult shifts are: N/2, N/2+1, N/2–1, N/2+2, N/2–2, . . . , N–1, 1.

The optimal ordering is to intersperse the least difficult shifts between the most difficult shifts. The two most difficult shifts are placed at the top and bottom rows of connec tions, since the outer routing channels are not shared and may be used exclusively by the adjacent row. The optimal relative shift assignments for each of a 4, 6, 8, 14, and 16 slot backplane are shown below in Table 1.

TABLE 1

| ROW | 4-SLOT | 6-SLOT | 8-SLOT | 14-SLOT | 16-SLOT |
|---|---|---|---|---|---|
| 1 | 2-shift | 3-shift | 4-shift | 7-shift | 8-shift |
| 2 | 1-shift | 1-shift | 1-shift | 1-shift | 1-shift |
| 3 | 3-shift | 2-shift | 3-shift | 6-shift | 7-shift |
| 4 | | 5-shift | 2-shift | 2-shift | 2-shift |
| 5 | | 4-shift | 6-shift | 5-shift | 6-shift |
| 6 | | | 7-shift | 3-shift | 3-shift |
| 7 | | | 5-shift | 4-shift | 5-shift |
| 8 | | | | 11-shift | 4-shift |
| 9 | | | | 10-shift | 12-shift |
| 10 | | | | 12-shift | 13-shift |
| 11 | | | | 9-shift | 11-shift |
| 12 | | | | 13-shift | 14-shift |
| 13 | | | | 8-shift | 10-shift |
| 14 | | | | | 15-shift |
| 15 | | | | | 9-shift |

To determine an optimal assignment of relative shifts to rows, each shift may be assigned a relative weight that is equal to the number of routing channels required. Using the number of routing channels required as a relative weight, the optimal order is found by grouping the shifts to minimize the number of routing channels between neighboring rows, and hence to reduce the number of require layers. Table 2 below illustrates a 16 slot example.

TABLE 2

| ROW | Relative Shift | Channels Required | Sum of Neighbors | Numbers of Layers Required (sum/2) |
|---|---|---|---|---|
| 1 | 8-shift | 16 | 16 + 2 = 18 | 18/2 = 9 |
| 2 | 1-shift | 2 | 2 + 14 = 16 | 16/2 = 8 |
| 3 | 7-shift | 14 | 14 + 4 = 18 | 18/2 = 9 |
| 4 | 2-shift | 4 | 4 + 12 = 16 | 16/2 = 8 |
| 5 | 6-shift | 12 | 12 + 6 = 18 | 18/2 = 9 |
| 6 | 3-shift | 6 | 6 + 10 = 16 | 16/2 = 8 |
| 7 | 5-shift | 10 | 10 + 8 = 18 | 18/2 = 9 |
| 8 | 4-shift | 8 | 8 + 9 = 17 | 17/2 = 8.5 |
| 9 | 12-shift | 9 | 9 + 7 = 16 | 16/2 = 8 |
| 10 | 13-shift | 7 | 7 + 11 = 18 | 18/2 = 9 |
| 11 | 11-shift | 11 | 11 + 5 = 16 | 16/2 = 8 |
| 12 | 14-shift | 5 | 5 + 13 = 18 | 18/2 = 9 |
| 13 | 10-shift | 13 | 13 + 3 = 16 | 16/2 = 8 |
| 14 | 15-shift | 3 | 3 + 15 = 18 | 18/2 = 9 |
| 15 | 9-shift | 15 | | |
| | Total req. = | 135 | | Max = 9 |

The optimal ordering results in the backplane using N divided by two plus one (N/2+1) signal layers. For the 16 slot example, nine signal layers are required to route the backplane. This limitation may also be understood by comparing the total number of available routing channels to the number of routing channels required to route the backplane. In this 16 slot example there are 16 channels per layer. With nine layers, this results in a total of 9 times 16 or 144 possible routing channels. The total number of required routing channels is 135 (see Table 2). This leaves nine spare channels (144–135). Notably, eight layers only provides (8*16) 128 routing channels, which is insufficient to route the 16 slot example.

Since there are some spare channels in the 16 slot example, there are alternative ways to assign the relative shifts and not exceed the optimal nine layers. Table 3 below gives an alternative preferred assignment of relative shifts for a 16 slot example.

TABLE 3

| ROW | Relative Shift | Channels Required |
|---|---|---|
| 1 | 8-shift | 16 |
| 2 | 1-shift | 2 |
| 3 | 7-shift | 14 |
| 4 | 2-shift | 4 |
| 5 | 6-shift | 12 |
| 6 | 3-shift | 6 |
| 7 | 5-shift | 10 |
| 8 | 4-shift | 8 |
| 9 | 12-shift | 9 |
| 10 | 13-shift | 7 |
| 11 | 11-shift | 11 |
| 12 | 14-shift | 3 |
| 13 | 10-shift | 13 |
| 14 | 15-shift | 5 |
| 15 | 9-shift | 15 |

In a preferred arrangement, a table of relative shifts, such as Tables 1 and 3, is stored on each circuit board so that the circuit board can use that information, along with its slot position to determine which pins or physical port to use to communicate with the other boards in the same backplane.

The present invention provides a backplane system that optimizes the path between traces and the number of layers required for a multi-layered circuit board by assigning rows of connections a relative shift, which is a predetermined relative number of slots. The adjacent rows of connections are selected such that the most complex and least complex relative shifts are placed adjacent to each other. Accordingly, an optimal backplane configuration for a full mesh is provided.

Whereas the present invention has been described with respect to specific embodiments thereof, it will be understood that various changes and modifications will be suggested to one skilled in the art and it is intended that the invention encompass such changes and modifications as fall within the scope of the appended claims. In particular, differential pairs or other arrangements of signals may be used. And, of course, the principles of the invention are applicable to any number of slots, including those not specifically mention herein. Also, more than one routing channel may be provided between the rows of pins, thereby increasing the number of available routing channels, which proportionately reduces the number of signal layers required. For example, if two routing channels per layer (rather than one) are accommodated in the six slot example shown in FIG. 2, then half as many signal layers, i.e., two rather than four, are required.

The invention claimed is:

1. An electronic system comprising:
   a backplane including a multi-layer circuit board with a plurality of traces and N slots for receiving circuit packs and at least N−1 rows of connection points for interconnecting the N slots one-to-the other;
   wherein each connection point is located at a point defined by an intersection of a slot X and a row Y, where X and Y are integers;
   wherein each row of connection points has a different predetermined relative shift R associated with it, where R is an integer;

wherein a connection point at row Y is connected to another connection point located at row Y and at a slot that is R slots away from itself.

2. An electronic system comprising:

a backplane including a multi-layer circuit board with a plurality of traces and N slots for receiving circuit packs and at least N−1 sets of connection points for interconnecting the N slots one-to-the other;

wherein each set of connection points is selected to connect via the plurality of traces to a slot that is a predetermined relative number of slots away from said slot wherein the predetermined relative number of slots away for each set of connection points determines a number of required routing channels for each set of connection points and the predetermined relative number of slots away is assigned to each set of connection points such that adjacent sets of connection points are selected such that one set of the adjacent sets has a maximum number of required routing channels and another set of the adjacent sets has a minimum number of required routing channels.

3. The system of claim 2 wherein the multi-layer circuit board has N divided by 2 plus 1 signal layers.

4. The system of claim 2 wherein the multi-layer circuit board has no more than N divided by 2 plus 1 signal layers.

5. The system of claim 4 wherein the multi-layer circuit board has no vertical routing that is perpendicular to a plane including the sets of connection points.

6. The system of claim 2 wherein an end set of connection points that is directly adjacent to only one other set of connection points is assigned a predetermined relative number of slots away equal to N divided by 2.

7. The system of claim 6 wherein another end set of connection points that is directly adjacent to only one other set of connection points is assigned a predetermined relative number of slots away equal to N divided by 2 plus 1.

8. The system of claim 7 wherein a set of connection points near a midpoint of the at least N−1 sets of connection points is assigned a predetermined relative number of slots away equal to 1.

9. The system of claim 1 wherein the different predetermined relative shift R determines a number of required routing channels for each row of connection points and the different predetermined relative shift R associated with each row of connection points is such that adjacent rows of connection points are selected such that an available number of routing channels is not exceeded and the multi-layer circuit board has no more than N/2+1 layers, where N is an even integer.

10. The system of claim 1 wherein the backplane has an interconnect topology that is a full mesh for N slots.

11. The system of claim 1 further comprising at least one circuit pack in the N slots, where the at least one circuit pack uses its slot position and a table of relative shifts to determine a physical port to communicate with another circuit pack in the N slots.

12. The system of claim 2 wherein each routing channel accommodates one differential pair of signals.

13. A multi-layered circuit board for use in an electronic system comprising:

a plurality of traces for making electrical connections;

N slots for receiving circuit packs;

N−1 rows of connection points for interconnecting the N slots one to the other using the plurality of traces;

wherein each connection point is located at a slot X and a row Y, where X is an integer from 1 to N and Y is an integer from 1 to N−1;

wherein each row of connection points is assigned a predetermined relative shift R, where R is an integer from 1 to N−1; and wherein each connection point that shares a row Y is connected to another connection point that is at row Y and is a distance of R slots from itself.

14. The multi-layered circuit board of claim 13 wherein the predetermined relative shift R for each row of connection points determines a number of required routing channels for each row of connection points and the predetermined relative shift R is assigned to each row of connection points such that adjacent rows of connection points are selected such that one row of the adjacent rows has a maximum number of required routing channels and another row of the adjacent sets has a minimum number of required routing channels.

15. The multi-layered circuit board of claim 13 wherein each connection point comprises a differential pair of connections.

* * * * *